US012618904B2

(12) United States Patent
Li et al.

(10) Patent No.: US 12,618,904 B2
(45) Date of Patent: May 5, 2026

(54) VALVE-LEVEL FAULT LOCATION METHOD AND SYSTEM FOR CONVETERS BASED ON HORIZONTAL AND VERTICAL STATE DIFFERENCES OF VALVES

(71) Applicant: South China University of Technology, Guangzhou (CN)

(72) Inventors: Xiaohua Li, Guangzhou (CN); Shanshan Yin, Guangzhou (CN); Hao Li, Guangzhou (CN); Yuchen He, Guangzhou (CN); Yixin Zheng, Guangzhou (CN)

(73) Assignee: South China University of Technology, Guangzhou City (CN)

( * ) Notice: Subject to any disclaimer, the term of this patent is extended or adjusted under 35 U.S.C. 154(b) by 388 days.

(21) Appl. No.: 18/269,584

(22) PCT Filed: Oct. 8, 2022

(86) PCT No.: PCT/CN2022/123885
§ 371 (c)(1),
(2) Date: Jun. 26, 2023

(87) PCT Pub. No.: WO2023/197539
PCT Pub. Date: Oct. 19, 2023

(65) Prior Publication Data
US 2024/0377456 A1 Nov. 14, 2024

(30) Foreign Application Priority Data
Apr. 13, 2022 (CN) ........................ 202210382559.X

(51) Int. Cl.
*G01R 31/00* (2006.01)
*G01R 31/327* (2006.01)

(52) U.S. Cl.
CPC ............................... *G01R 31/3275* (2013.01)

(58) Field of Classification Search
CPC ...... G01R 31/3275; G01R 31/00; Y02E 60/60
See application file for complete search history.

(56) References Cited

U.S. PATENT DOCUMENTS

2015/0256094 A1* 9/2015 Chaudhuri .......... H02M 7/7575
363/35
2018/0196099 A1* 7/2018 Gao ........................ G01R 31/08
(Continued)

FOREIGN PATENT DOCUMENTS

CN 104267288 A 1/2015
CN 105515472 A 4/2016
(Continued)

OTHER PUBLICATIONS

Mu et al. ("A Novel Fault Identification Method for HVDC Converter Station Section Based on Energy Relative Entropy", 2022 (Year: 2022).*
(Continued)

*Primary Examiner* — Eyob Hagos
(74) *Attorney, Agent, or Firm* — The Dobrusin Law Firm, P.C.

(57) ABSTRACT

A valve-level fault location method and system for converters based on horizontal and vertical state differences of valves are disclosed. The method includes: collecting current data of a converter; calculating a time width of each valve conduction state, an alternating current conduction width, and a direct current conduction width based on the current data; constructing horizontal and vertical timing features on a circuit structure of the converter according to the alternating current conduction width and the direct current conduction width; comparing the time width of each valve conduction state with a time width of a normal valve conduction state, and outputting each valve state signal; and implementing valve-level fault location for the converter according to the time width of each valve conduction state, (Continued)

the alternating current conduction width, the direct current conduction width, the horizontal and vertical timing features, each valve state signal, and the current data. By constructing a difference between horizontal and vertical conduction widths of an alternating current and a direct current based on current timing features, valve-level faults of converters can be accurately located.

8 Claims, 7 Drawing Sheets

(56)                    References Cited

U.S. PATENT DOCUMENTS

2018/0226882 A1 *   8/2018   Jonsson ............... H02M 7/219
2022/0365125 A1    11/2022   Li et al.
2022/0397615 A1    12/2022   Li et al.

FOREIGN PATENT DOCUMENTS

| CN | 110729746 A | * | 1/2020 | ........... G01R 31/086 |
|----|-------------|---|--------|-------------------------|
| CN | 110797898 A | * | 2/2020 | ............... H02J 3/36 |
| CN | 111239471 A |   | 6/2020 | |
| CN | 112630592 A |   | 4/2021 | |
| CN | 110729705 B | * | 6/2021 | ............... H02H 7/20 |
| CN | 111157827 B | * | 6/2021 | ............. G01R 31/56 |
| CN | 111934289 B | * | 8/2022 | ............. H02H 7/268 |
| CN | 114879023 A |   | 8/2022 | |
| CN | 111157827 A |   | 12/2022 | |
| WO | 2016/020521 A1 |   | 2/2016 | |

OTHER PUBLICATIONS

PCT International Search Report & Written Opinion dated Sep. 1, 2023, Application No. PCT/CN2022/123885).

* cited by examiner

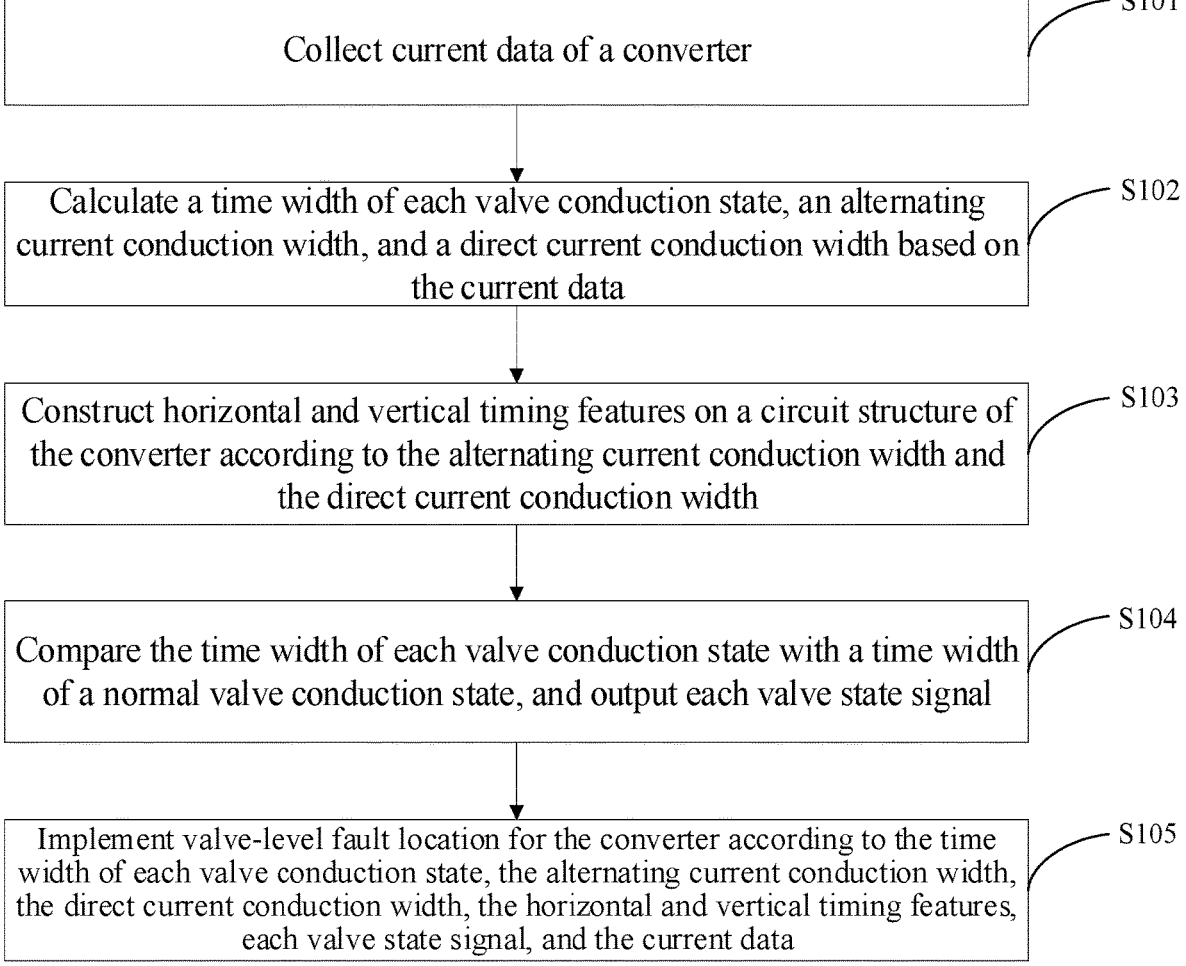

S101

Collect current data of a converter

S102

Calculate a time width of each valve conduction state, an alternating current conduction width, and a direct current conduction width based on the current data

S103

Construct horizontal and vertical timing features on a circuit structure of the converter according to the alternating current conduction width and the direct current conduction width

S104

Compare the time width of each valve conduction state with a time width of a normal valve conduction state, and output each valve state signal

S105

Implement valve-level fault location for the converter according to the time width of each valve conduction state, the alternating current conduction width, the direct current conduction width, the horizontal and vertical timing features, each valve state signal, and the current data

Fig. 1

Signal collection processing

Collect alternating and direct currents
$i_{dH}, i_{dN}, i_{aY}, i_{bY}, i_{cY}, i_{aD}, i_{bD}, i_{cD}$ Calculate various conduction widths: $t_{YHYm}$, $t_{DHYm}$, $t_{dH}$, $t_{dN}$, $t_{Y\_top}$, $t_{Y\_bottom}$, $t_{D\_top}$, $t_{D\_bottom}$ Detect a valve state: $cs_{YHm}, cs_{DHm}$ $(t_{dH} < T)$ — Y → Line fault k9

N $(t_{dH} - t_{dN} > t_{set})$ — Y

N $cs_{jHm} = -1 \lor cs_{jHm} = 1$ — N

Y $t_{j\_top} \neq t_{j\_bottom}$ — Y $i_{dmax} - i_{ce} \geq 0 \land CF \land t_{dH} = Max(t_Y, t_D)$ — Y

N k1、k2、k3 Internal fault k4、k5

N k6、k8 External fault k7

Fault area determination

Fig. 4

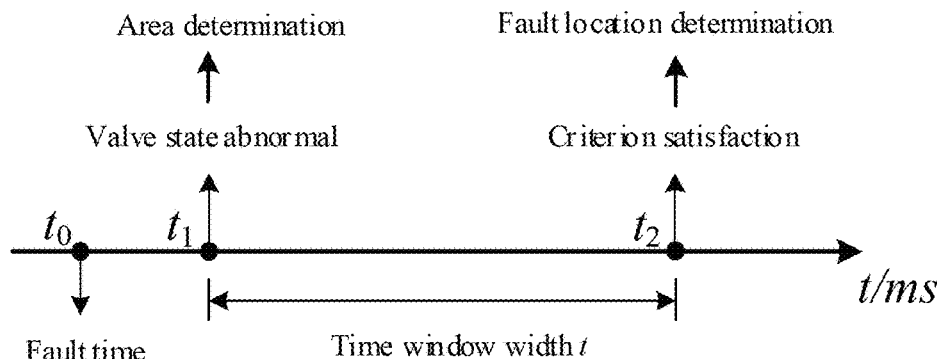

Area determination        Fault location determination

Valve state abnormal        Criterion satisfaction $t_0$        $t_1$        $t_2$        $t/ms$ Fault time        Time window width $t$

Fig. 5

VALVE-LEVEL FAULT LOCATION METHOD AND SYSTEM FOR CONVETERS BASED ON HORIZONTAL AND VERTICAL STATE DIFFERENCES OF VALVES

FIELD OF THE INVENTION

The present disclosure relates to a valve-level fault location method and system for converters based on horizontal and vertical state differences of valves, which fall within the technical field of high-voltage direct current transmission.

BACKGROUND OF THE INVENTION

As a core element of a high-voltage direct current transmission system, a converter realizes the function of alternating current and direct current conversion. However, the converter is characterized by being easily damaged and expensive, and it is therefore necessary to ensure the operation safety of the converter. Therefore, it is of great significance to quickly locate faults of the converter to clear the faults in time and ensure the power transmission.

The existing methods are to mainly locate fault points through protection actions of the converter in combination with fault response features within a period of time after the converter is faulted. However, the methods mainly have the following two problems: firstly, under the action of a control system, current amplitude features after the converter is faulted are not obvious, which easily leads to the failure of the existing fault location methods; secondly, under the condition of external faults, the response of the converter makes electrical features of the external faults similar to electrical features of internal faults, which results in the uncertainty of the protection actions, thus easily leading to the misjudgment of fault locations. Further, even if current research is capable of correctly determine fault types, fault valves and fault phases under fault types cannot be identified. In order to quickly locate the fault valves and the fault phase, it is proposed to add current measuring points on each bridge arm of the converter. However, the addition of the measuring points is not easy to realize in engineering, increases the equipment cost, and has great limitations in engineering application.

For this reason, there is an urgent need for a valve-level fault location method for converters based on horizontal and vertical state differences of valves, which has small limitations, low cost and can quickly locate fault valves and fault phases.

SUMMARY OF THE INVENTION

In view of this, the present disclosure provides a valve-level fault location method and system for converters based on horizontal and vertical state differences of valves. By constructing a difference between horizontal and vertical conduction widths of an alternating current and a direct current based on current timing features, valve-level faults of converters can be accurately located, thereby assisting in adjusting a power system and handling faults by staff.

A first object of the present disclosure is to provide a valve-level fault location method for converters based on horizontal and vertical state differences of valves.

A second object of the present disclosure is to provide a valve-level fault location system for converters based on horizontal and vertical state differences of valves.

A third object of the present disclosure is to provide a computer device.

A fourth object of the present disclosure is to provide a storage medium.

The first object of the present disclosure may be achieved by adopting the following technical solution:

The valve-level fault location method for converters based on horizontal and vertical state differences of valves includes:

collecting current data of a converter, the current data including three-phase alternating currents of a j bridge, a direct-current high-voltage current, and a direct-current neutral current, where j=Y/D, Y representing a high voltage, and D representing a low voltage;

calculating a time width of each valve conduction state, an alternating current conduction width, and a direct current conduction width based on the current data;

constructing horizontal and vertical timing features on a circuit structure of the converter according to the alternating current conduction width and the direct current conduction width;

comparing the time width of each valve conduction state with a time width of a normal valve conduction state, and outputting each valve state signal; and implementing valve-level fault location for the converter according to the time width of each valve conduction state, the alternating current conduction width, the direct current conduction width, the horizontal and vertical timing features, each valve state signal, and the current data.

Further, the calculating a time width of each valve conduction state, an alternating current conduction width, and a direct current conduction width based on the current data specifically includes:

calculating a plurality of valve currents of the j bridge and a valve current base value of the j bridge according to absolute values of the three-phase alternating currents of the j bridge;

selecting a ratio of one of the valve currents to the valve current base value as a valve current relative relationship, so as to obtain a plurality of valve current relative relationships;

obtaining a plurality of valve conduction states according to each valve current relative relationship, and integrating each valve conduction state to obtain a time width of each valve conduction state;

constructing an alternating current conduction width according to the time width of each valve conduction state, the alternating current conduction width including an alternating current outflow conduction width and an alternating current inflow conduction width; and constructing a direct current conduction width according to a direct-current high-voltage current amplitude and a direct-current neutral current amplitude, the direct current conduction width including a direct current inflow conduction width and a direct current outflow conduction width.

Further, the plurality of valve currents of the j bridge are calculated according to the absolute values of the three-phase alternating currents of the j bridge based on the following formulas:

$$i_{jV4} = \begin{cases} i_{ja}; i_{ja} > 0 \\ 0; i_{ja} \le 0 \end{cases} \quad i_{jV6} = \begin{cases} i_{jb}; i_{jb} > 0 \\ 0; i_{jb} \le 0 \end{cases} \quad i_{jV2} = \begin{cases} i_{jc}; i_{jc} > 0 \\ 0; i_{jc} \le 0 \end{cases}$$

$$i_{jV1} = \begin{cases} -i_{ja}; i_{ja} < 0 \\ 0; i_{ja} \ge 0 \end{cases} \quad i_{jV3} = \begin{cases} -i_{jb}; i_{jb} < 0 \\ 0; i_{jb} \ge 0 \end{cases} \quad i_{jV5} = \begin{cases} -i_{jc}; i_{jc} < 0 \\ 0; i_{jc} \ge 0 \end{cases}$$

where j=Y/D, $i_{jV1}$ represents a j-bridge V1 valve current, $i_{jV2}$ represents a j-bridge V2 valve current, $i_{jV3}$ represents a j-bridge V3 valve current, $i_{jV4}$ represents a j-bridge V4 valve current, $i_{jV5}$ represents a j-bridge V5 valve current, and $i_{jV6}$ represents a j-bridge V6 valve current.

The calculating a valve current base value of the j bridge according to absolute values of the three-phase alternating currents of the j bridge specifically includes: selecting half of a maximum value in the absolute values of the three-phase alternating currents of the j bridge as a valve current base value $i_{jbase}$ of the j bridge.

Further, the time width of each valve conduction state is compared with the time width of the normal valve conduction state according to the valve conduction width, and each valve state signal is constructed.

$$cs_{jHVm} = \begin{cases} 1; t_{jHVm} - t_{HVT\_normal} > \varepsilon \\ 0; -\varepsilon \le t_{jHVm} - t_{HVT\_normal} \le \varepsilon \\ -1; t_{jHVm} - t_{HVT\_normal} < -\varepsilon \end{cases} \quad (20)$$

where j=Y/D, m=1, 2, 3, 4, 5, 6, $\varepsilon$ represents a threshold, $cs_{jHVm}$ represents a valve state signal, 1 represents that the valve conduction state is overlong, 0 represents that the valve conduction state is normal, −1 represents that the valve conduction state is shortened, $t_{HVT\_normal}$ represents the time width of the normal valve conduction state, $t_{HVT\_normal}$=T/3.

Further, the obtaining a plurality of valve conduction states according to each valve current relative relationship and integrating each valve conduction state to obtain a time width of each valve conduction state specifically includes:

inputting each valve current relative relationship into a single-phase comparator, and obtaining a duty ratio of each valve current;

selecting a state in which the duty ratio of the valve current is greater than 1 as a valve conduction state, so as to obtain a plurality of valve conduction states; and integrating each valve conduction state to obtain the time width of each valve conduction state based on the following formula:

$$t_{jHVm} = \int_{-T}^{0} S_{jHVm} dt$$

where j=Y/D, m=1, 2, 3, 4, 5, 6, tjHVm represents a time width of the j-bridge Vm valve conduction state, and T represents a time width of a power frequency cycle.

Further, the alternating current conduction width is constructed according to the time width of each valve conduction state based on the following formulas:

$$\begin{cases} t_{Y\_bottom} = t_{YHV1} + t_{YHV3} + t_{YHV5} \\ t_{Y\_top} = t_{YHV2} + t_{YHV4} + t_{YHV6} \end{cases} ; \begin{cases} t_{D\_bottom} = t_{DHV1} + t_{DHV3} + t_{DHV5} \\ t_{D\_top} = t_{DHV2} + t_{DHV4} + t_{DHV6} \end{cases}$$

where $t_{Y\_bottom}$ represents a high-voltage bridge alternating current inflow conduction width, $t_{Y\_top}$ represents a high-voltage bridge alternating current outflow conduction width, $t_{D\_bottom}$ represents a low-voltage bridge alternating current inflow conduction width, $t_{D\_top}$ represents a low-voltage bridge alternating current outflow conduction width, $t_{YHV1}$, $t_{YHV3}$, and $t_{YHV5}$ represent time widths of a high-voltage bridge common anode valve conduction state, $t_{YHV2}$, $t_{YHV4}$, and $t_{YHV6}$ represent time widths of a high-voltage bridge common cathode valve conduction state, $t_{DHV1}$, $t_{DHV3}$, and $t_{DHV5}$ represent time widths of a low-voltage bridge common anode valve conduction state, and $t_{DHV2}$, $t_{DHV4}$, and $t_{DHV6}$ represent time widths of a low-voltage bridge common cathode valve conduction state.

The constructing a direct current conduction width according to a direct-current high-voltage current amplitude and a direct-current neutral current amplitude specifically includes:

defining a flow state of a direct-current high-voltage current and a flow state of a direct-current neutral current according to the direct-current high-voltage current amplitude and the direct-current neutral current amplitude based on the following formulas:

$$S_{dH} = \begin{cases} 1; i_{dH} \ge i_{set} \\ 0; i_{dH} < i_{set} \end{cases} ; S_{dN} = \begin{cases} 1; i_{dN} \ge i_{set} \\ 0; i_{dN} < i_{set} \end{cases}$$

where $S_{dH}$ represents the flow state of the direct-current high-voltage current, $S_{dN}$ represents the flow state of the direct-current neutral current, and $i_{set}$ represents a threshold of a direct current flow state; and integrating the flow state of the direct-current high-voltage current and the flow state of the direct-current neutral current in each power frequency cycle to obtain a direct current conduction width based on the following formulas:

$$t_{dH} = \int_{t-T}^{t} S_{dH} dt; t_{dN} = \int_{t-T}^{t} S_{dN} dt$$

where $t_{dH}$ represents a direct current inflow conduction width, and $t_{dN}$ represents a direct current outflow conduction width.

Further, the horizontal and vertical timing features are constructed on the circuit structure of the converter according to the alternating current conduction width and the direct current conduction width based on the following formulas:

$$\begin{cases} t_{DCVTF} = t_{dH} - t_{dN} \\ t_{ACVTF\_HB} = t_{Y\_top} - t_{Y\_bottom} \\ t_{ACVTF\_LB} = t_{D\_top} - t_{D\_bottom} \\ t_{ACVTF\_HLB} = t_{Y\_bottom} - t_{D\_top} \end{cases} ; \begin{cases} t_{THTF\_HB} = t_{dH} - t_{Y\_top} \\ t_{THTF\_LB} = t_{dH} - t_{D\_top} \\ t_{BHTF\_HB} = t_{dN} - t_{Y\_bottom} \\ t_{BHTF\_LB} = t_{dN} - t_{D\_bottom} \end{cases}$$

where $t_{DCVTF}$ represents a direct-current vertical timing feature, $t_{ACVTF\_HB}$ represents a high-voltage bridge vertical timing feature, $t_{ACVTF\_LB}$ represents a low-voltage bridge vertical timing feature, $t_{ACVTF\_HLB}$ represents a double-bridge vertical timing feature, $t_{THTF\_HB}$ represents a high-voltage bridge top horizontal timing feature, $t_{THTF\_LB}$ represents a low-voltage bridge top horizontal timing feature, $t_{BHTF\_HB}$ represents a high-voltage bridge bottom horizontal timing feature, and $t_{BHTF\_LB}$ represents a low-voltage bridge bottom horizontal timing feature.

Further, the implementing valve-level fault location for the converter according to the time width of each valve conduction state, the alternating current conduction width, the direct current conduction width, the horizontal and vertical timing features, each valve state signal, and the current data specifically includes:

determining whether the direct current inflow conduction width is less than the power frequency cycle;

determining that a fault is a line fault k9 if the direct current inflow conduction width is less than the power frequency cycle;

determining whether the direct-current vertical timing feature satisfies $t_{dH}-t_{dN}>\Delta$ if the direct current inflow conduction width is greater than or equal to the power frequency cycle, where $\Delta$ represents a value greater than 0;

determining whether the high-voltage bridge vertical timing feature satisfies $t_{Y\_top}\neq t_{Y\_bottom}$ or whether the low-voltage bridge vertical timing feature satisfies $t_{D\_top}\neq t_{D\_bottom}$ if the direct-current vertical timing feature satisfies $t_{dH}-t_{dN}>\Delta$;

determining that the fault is an external fault k7 if the high-voltage bridge vertical timing feature satisfies $t_{Y\_top}\neq t_{Y\_bottom}$ or the low-voltage bridge vertical timing feature satisfies $t_{D\_top}\neq t_{D\_bottom}$;

determining that the faults are internal fault k4 and k5 if the high-voltage bridge vertical timing feature does not satisfy $t_{Y\_top}\neq t_{Y\_bottom}$ or the low-voltage bridge vertical timing feature does not satisfy $t_{D\_top}\neq t_{D\_bottom}$;

determining whether the valve state signal is abnormal according to each valve state signal if the direct-current vertical timing feature does not satisfy $t_{dH}-t_{dN}>\Delta$;

determining, if the valve state signal is abnormal, whether three conditions are simultaneously satisfied: a maximum value of the direct-current high-voltage current and the direct-current neutral current is greater than a maximum value of the three-phase alternating currents of the j bridge, commutation fails, and there is no difference in high-voltage bridge or low-voltage bridge top horizontal timing features, if yes, determining that the faults are external faults k6 and k8, and if no, determining that the faults are internal faults k1, k2, and k3; and returning to collecting current data of a converter if the valve state signal is not abnormal.

Further, the method further includes:

further locating the internal faults to implement fault valve and fault phase location, specifically:

determining each internal fault type using data of the horizontal and vertical timing features in a time window width according to internal faults k1-k5, and obtaining internal fault types of k1, k3, and k5 which are successfully determined; and implementing fault valve and fault phase location using data of the time width of each valve conduction state in a converter bridge where the internal fault types of k1, k3, and k5 are located in the time window width.

The second object of the present disclosure may be achieved by adopting the following technical solution.

The valve-level fault location system for converters based on horizontal and vertical state differences of valves includes:

a collection unit, configured to collect current data of a converter, the current data including three-phase alternating currents of a j bridge, a direct-current high-voltage current, and a direct-current neutral current, where j=Y/D, Y representing a high voltage, and D representing a low voltage;

a calculation unit, configured to calculate a time width of each valve conduction state, an alternating current conduction width, and a direct current conduction width based on the current data;

a construction unit, configured to construct horizontal and vertical timing features on a circuit structure of the converter according to the alternating current conduction width and the direct current conduction width;

a comparison unit, configured to compare the time width of each valve conduction state with a time width of a normal valve conduction state, and output each valve state signal; and a fault location unit, configured to implement valve-level fault location for the converter according to the time width of each valve conduction state, the alternating current conduction width, the direct current conduction width, the horizontal and vertical timing features, each valve state signal, and the current data.

The third object of the present disclosure may be achieved by adopting the following technical solution.

The computing device includes a processor and a memory for storing a program executable by the processor. The processor, when executing the program stored in the memory, implements the foregoing valve-level fault location method for converters.

The fourth object of the present disclosure may be achieved by adopting the following technical solution.

The storage medium stores a program. The program, when executed by a processor, implements the foregoing valve-level fault location method for converters.

The present disclosure has the following beneficial effects in contrast to the related art.

According to the present disclosure, by constructing a difference between horizontal and vertical conduction widths of an alternating current and a direct current based on current timing features, valve-level faults of converters can be accurately located. In the meantime, according to the present disclosure, fault valves and fault phases of internal faults as well as external faults and line faults can be located without loss of generality. In addition, the method of the present disclosure can monitor the converter without using additional current measuring point equipment, thereby not only saving equipment cost but also having small limitations in engineering application.

BRIEF DESCRIPTION OF THE DRAWINGS

In order to more clearly illustrate the technical solutions of the embodiments of the present disclosure or the related art, the drawings required to describe the embodiments or the related art will be briefly introduced below. Apparently, the drawings described below are merely some embodiments of the present disclosure, and those of ordinary skill in the art may obtain other drawings according to structures shown in these drawings without inventive effort.

FIG. 1 is a flowchart of a valve-level fault location method for converters according to Embodiment 1 of the present disclosure;

FIG. 4 is a flowchart of fault area location according to Embodiment 1 of the present disclosure;

FIG. 5 is a schematic diagram of a time window width for fault location according to Embodiment 1 of the present disclosure;

DETAILED DESCRIPTION OF THE EMBODIMENTS

In order to make the objects, technical solutions and advantages of the embodiments of the present disclosure more apparent, the technical solutions in the embodiments of the present disclosure will be clearly and completely described below with reference to the drawings in the embodiments of the present disclosure. Apparently, the described embodiments are merely some embodiments of the present disclosure, rather than all of the embodiments. Based on the embodiments of the present disclosure, all other embodiments obtained by those of ordinary skill in the art without inventive effort should fall within the scope of the present disclosure.

Embodiment 1

In traditional high-voltage direct current transmission projects, 12-pulse bridge converters are mostly used. An inverter side covers all fault types at a rectifier side. In addition, there is a special problem at the inverter side, namely, the problem of commutation failure. In this embodiment, in order not to lose generality, the inverter side is taken as a research object.

As shown in FIG. 1, this embodiment provides a valve-level fault location method for converters based on horizontal and vertical state differences of valves. The method includes the following steps.

At S101, current data of a converter is collected.

Figure 2:
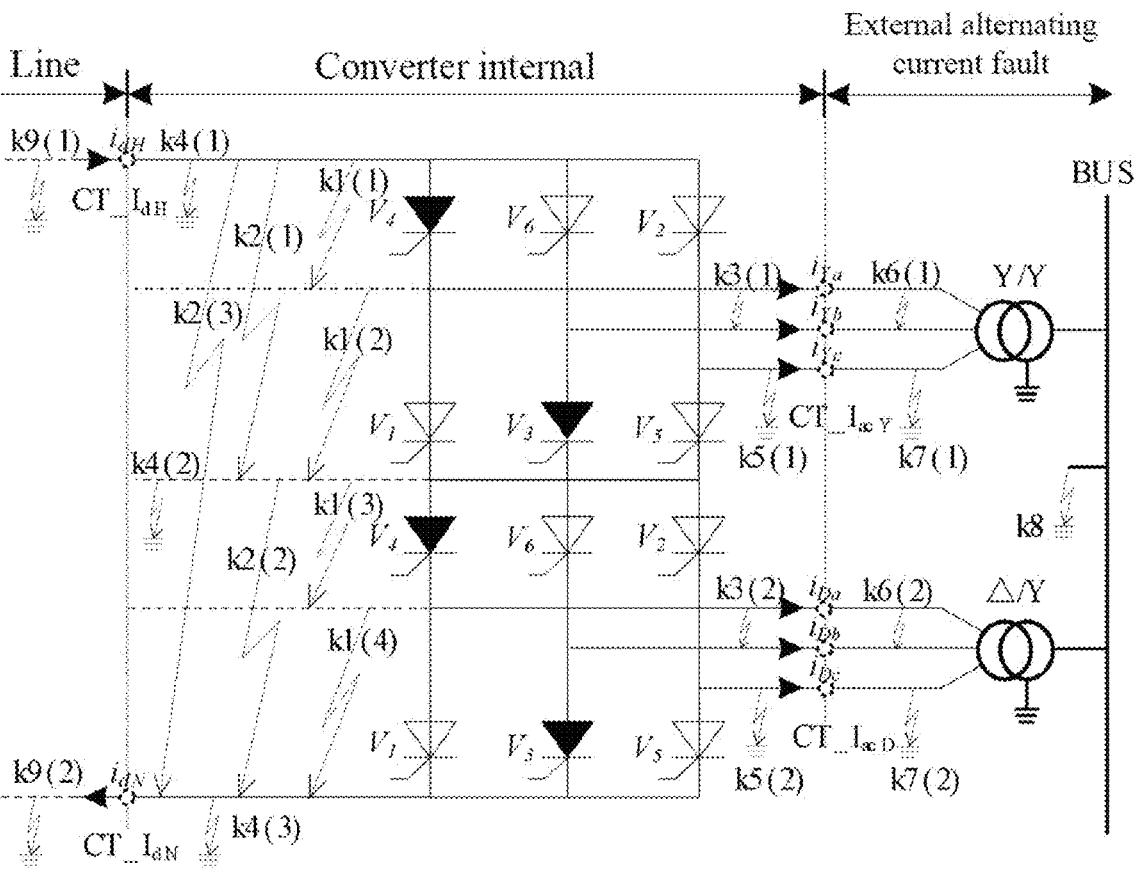
FIG. 2 is a distribution diagram of 9 faults and acquired current data of a converter and a neighbor area thereof according to Embodiment 1 of the present disclosure.

As shown in FIG. 2, in this embodiment, currents $i_{Ya}$, $i_{Yb}$, and $i_{Yc}$ measured by a converter high-voltage bridge alternating-current three-phase current transformer $CT\_I_{acY}$ and currents $i_{Da}$, $i_{Db}$, and $i_{Dc}$ measured by a converter low-voltage bridge alternating-current three-phase current transformer $CT\_I_{acD}$ in a high-voltage direct current transmission system (LCC-HVDC) at an inverter side of a direct current engineering model are collected. In this embodiment, a direct current $i_{dH}$ measured by a converter direct-current high-voltage direct current transformer $CT\_I_{dH}$ and a direct current $i_{dN}$ measured by a converter direct-current neutral direct current transformer $CT\_I_{dN}$ are collected.

In this embodiment, $i_{Ya}$, $i_{Yb}$, $i_{Yc}$, $i_{Da}$, $i_{Db}$, and $i_{Dc}$ are all represented by $i_{ja}$, $i_{jb}$, and $i_{jc}$, and are collectively referred to as three-phase alternating currents of a j bridge, where j=Y/D, Y represents a high voltage, and D represents a low voltage. A converter direct-current high-voltage current is $i_{dH}$, and a converter direct-current neutral current is $i_{dN}$.

The current data in this embodiment includes the three-phase alternating currents of the j bridge, a direct-current high-voltage current, and a direct-current neutral current.

At S102, a time width of each valve conduction state, an alternating current conduction width, and a direct current conduction width are calculated based on the current data.

At S1021, a plurality of valve currents of the j bridge and a valve current base value of the j bridge are calculated according to absolute values of the three-phase alternating currents of the j bridge.

(1) Absolute values of the three-phase alternating currents of the j bridge are obtained.

(2) The plurality of valve currents of the j bridge are calculated according to the absolute values of the three-phase alternating currents of the j bridge based on the following formulas:

$$i_{jV4} = \begin{cases} i_{ja}; i_{ja} > 0 \\ 0; i_{ja} \leq 0 \end{cases} \quad i_{jV6} = \begin{cases} i_{jb}; i_{jb} > 0 \\ 0; i_{jb} \leq 0 \end{cases} \quad i_{jV2} = \begin{cases} i_{jc}; i_{jc} > 0 \\ 0; i_{jc} \leq 0 \end{cases}$$

$$i_{jV1} = \begin{cases} -i_{ja}; i_{ja} < 0 \\ 0; i_{ja} \geq 0 \end{cases} \quad i_{jV3} = \begin{cases} -i_{jb}; i_{jb} < 0 \\ 0; i_{jb} \geq 0 \end{cases} \quad i_{jV5} = \begin{cases} -i_{jc}; i_{jc} < 0 \\ 0; i_{jc} \geq 0 \end{cases}$$

where j=Y/D, $i_{jV1}$ represents a j-bridge V1 valve current, $i_{jV2}$ represents a j-bridge V2 valve current, $i_{jV3}$ represents a j-bridge V3 valve current, $i_{jV4}$ represents a j-bridge V4 valve current, $i_{jV5}$ represents a j-bridge V5 valve current, and $i_{jV6}$ represents a j-bridge V6 valve current.

In this embodiment, twelve valve currents, which are respectively a high-voltage bridge V1 valve current, a high-voltage bridge V2 valve current, a high-voltage bridge V3 valve current, a high-voltage bridge V4 valve current, a high-voltage bridge V5 valve current, a high-voltage bridge V6 valve current, a low-voltage bridge V1 valve current, a low-voltage bridge V2 valve current, a low-voltage bridge V3 valve current, a low-voltage bridge V4 valve current, a low-voltage bridge V5 valve current, and a low-voltage bridge V6 valve current, are obtained.

(3) The calculating a valve current base value of the j bridge according to absolute values of the three-phase alternating currents of the j bridge specifically includes: selecting half of a maximum value in the absolute values of the three-phase alternating currents of the j bridge as a valve current base value $i_{jbase}$ of the j bridge.

In this embodiment, half of a maximum value of absolute values of three-phase alternating currents of a high-voltage bridge is selected as a valve current base value $i_{Ybase}$ of the high-voltage bridge, and half of a maximum value of absolute values of three-phase alternating currents of a low-voltage bridge is selected as a valve current base value $i_{Dbase}$ of the low-voltage bridge.

At S1022, a ratio of one of the valve currents to the valve current base value is selected as a valve current relative relationship, so as to obtain a plurality of valve current relative relationships.

The formulas of step S1022 and step S1021 (3) in this embodiment are as follows:

$$\begin{cases} S_{jVm} = \dfrac{i_{jVm}}{i_{jbase}} \\ i_{jbase} = \dfrac{\max(|i_{ja}|, |i_{jb}|, |i_{jc}|)}{2} \end{cases}$$

where j=Y/D, m=1, 2, 3, 4, 5, 6, $S_{jVm}$ represents a j-bridge Vm valve current relative relationship, $i_{jbase}$ represents a j-bridge valve current base value, $|i_{ja}|$, $|i_{jb}|$, and $|i_{jc}|$ represent the absolute values of the three-phase alternating currents of the j bridge, and $Max(|i_{ja}|,|i_{jb}|,|i_{jc}|)$ represents the maximum value of the absolute values of the three-phase alternating currents of the j bridge.

Twelve valve current relative relationships are obtained in this embodiment.

At S1023, a plurality of valve conduction states are obtained according to each valve current relative relationship, and each valve conduction state is integrated to obtain a time width of each valve conduction state.

(1) Each valve current relative relationship $S_{jVm}$ is input into a single-phase comparator, and a duty ratio of each valve current is obtained.

(2) A state in which the duty ratio of the valve current is greater than 1 is selected as a valve conduction state $S_{jHVm}$, so as to obtain a plurality of valve conduction states.

$$S_{jHVm} = 1; S_{jVm} > 1$$

where j=Y/D, m=1, 2, 3, 4, 5, 6, and $S_{jHVm}$ represents a j-bridge Vm valve conduction state.

(3) In each power frequency cycle, each valve conduction state $S_{jHVm}$ is integrated to obtain a time width $t_{jHVm}$ of each valve conduction state based on the following formula:

$$t_{jHVm} = \int_{-T}^{0} S_{jHVm} dt$$

where j=Y/D, m=1, 2, 3, 4, 5, 6, $t_{jHVm}$ represents a time width of the j-bridge Vm valve conduction state, and T represents a time width of a power frequency cycle.

At S1024, the alternating current conduction width is constructed according to the time width of each valve conduction state.

High-voltage and low-voltage bridge alternating current outflow conduction widths are constructed according to time widths of high-voltage bridge and low-voltage bridge common cathode valve conduction states, and high-voltage and low-voltage bridge alternating current inflow conduction widths are constructed according to time widths of high-voltage and low-voltage bridge common anode valve conduction states.

$$\begin{cases} t_{Y\_bottom} = t_{YHV1} + t_{YHV3} + t_{YHV5} \\ t_{Y\_top} = t_{YHV2} + t_{YHV4} + t_{YHV6} \end{cases} ; \begin{cases} t_{D\_bottom} = t_{DHV1} + t_{DHV3} + t_{DHV5} \\ t_{D\_top} = t_{DHV2} + t_{DHV4} + t_{DHV6} \end{cases}$$

where $t_{Y\_bottom}$ represents the high-voltage bridge alternating current inflow conduction width, $t_{Y\_top}$ represents the high-voltage bridge alternating current outflow conduction width, $t_{D\_bottom}$ represents the low-voltage bridge alternating current inflow conduction width, $t_{D\_top}$ represents the low-voltage bridge alternating current outflow conduction width, $t_{YHV1}$, $t_{YHV3}$, and $t_{YHV5}$ represent the time widths of the high-voltage bridge common anode valve conduction state, $t_{YHV2}$, $t_{YHV4}$, and $t_{YHV6}$ represent the time widths of the high-voltage bridge common cathode valve conduction state, $t_{DHV1}$, $t_{DHV3}$, and $t_{DHV5}$ represent the time widths of the low-voltage bridge common anode valve conduction state, and $t_{DHV2}$, $t_{DHV4}$, and $t_{DHV6}$ represent the time widths of the low-voltage bridge common cathode valve conduction state.

In this embodiment, the high-voltage bridge alternating current inflow conduction width and the high-voltage bridge alternating current outflow conduction width are collectively referred to as a high-voltage bridge alternating current conduction width, and the low-voltage bridge alternating current inflow conduction width and the low-voltage bridge alternating current outflow conduction width are collectively referred to as a low-voltage bridge alternating current conduction width.

In this embodiment, the alternating current conduction width includes a high-voltage bridge alternating current conduction width and a low-voltage bridge alternating current conduction width.

At S1025, the direct current conduction width is constructed according to a direct-current high-voltage current amplitude and a direct-current neutral current amplitude.

(1) The direct-current high-voltage current being greater than $i_{set}$ is defined as a flow state $S_{dH}$ of the direct-current high-voltage current, and the direct-current neutral current being greater than $i_{set}$ is defined as a flow state $S_{dN}$ of the direct-current neutral current, based on the following formulas:

$$S_{dH} = \begin{cases} 1; i_{dH} \geq i_{set} \\ 0; i_{dH} < i_{set} \end{cases}; S_{dN} = \begin{cases} 1; i_{dN} \geq i_{set} \\ 0; i_{dN} < i_{set} \end{cases}$$

where $S_{dH}$ represents the flow state of the direct-current high-voltage current, $S_{dN}$ represents the flow state of the direct-current neutral current, and $i_{set}$ represents a threshold of a direct current flow state.

(2) Conduction widths of the flow state $S_{dH}$ of the direct-current high-voltage current and the flow state $S_{dN}$ of the direct-current neutral current in each power frequency cycle are obtained through an integrator, based on the following formulas:

$$t_{dH} = \int_{t-T}^{t} S_{dH} dt; t_{dN} = \int_{t-T}^{t} S_{dN} dt$$

where $t_{dH}$ represents a direct current inflow conduction width, and $t_{dN}$ represents a direct current outflow conduction width.

In this embodiment, the direct current inflow conduction width and the direct current outflow conduction width are collectively referred to as the direct current conduction width.

In this embodiment, the alternating and direct current conduction widths include the alternating current conduction width and the direct current conduction width.

At S103, horizontal and vertical timing features are constructed on a circuit structure of the converter according to the alternating current conduction width and the direct current conduction width.

In this embodiment, the horizontal and vertical timing features are constructed specifically as follows.

Figure 3:
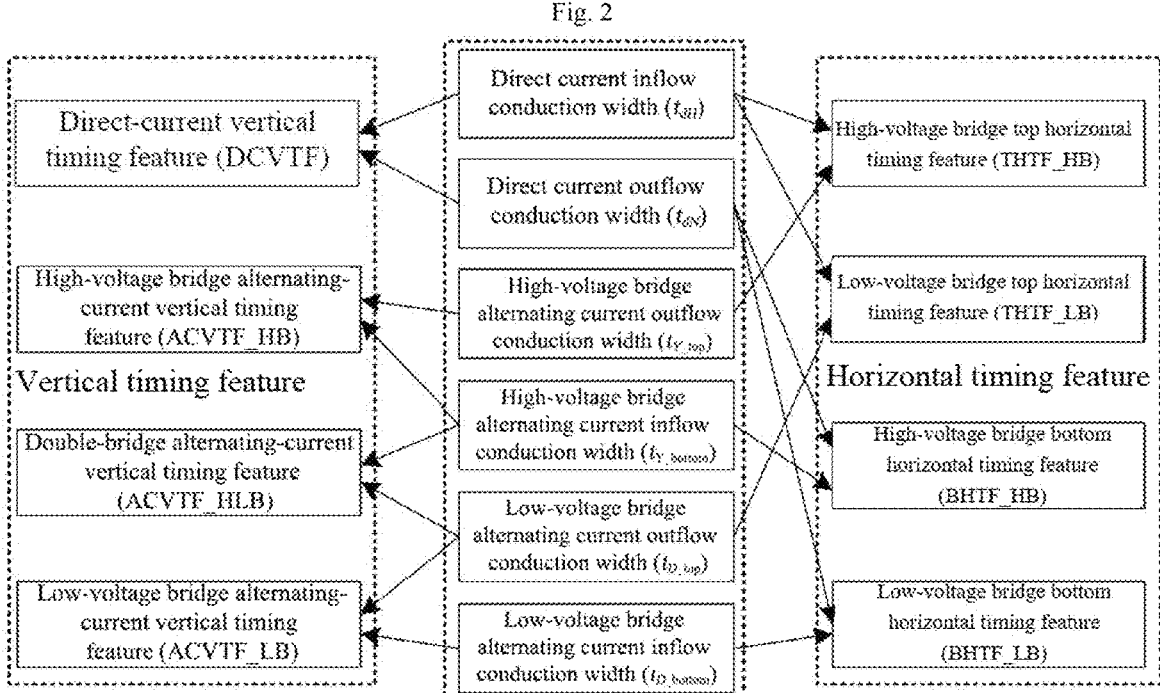
FIG. 3 is a diagram of a relationship between conduction width types and horizontal and vertical timing features according to Embodiment 1 of the present disclosure.

As shown in FIG. 3, a, a relationship between the direct current inflow conduction width and the direct current outflow conduction width is defined as a direct-current vertical timing feature; b, a relationship between the high-voltage bridge alternating current outflow conduction width and the high-voltage bridge alternating current inflow conduction width is defined as a high-voltage bridge vertical timing feature; c, a relationship between the low-voltage bridge alternating current outflow conduction width and the low-voltage bridge alternating current inflow conduction width is defined as a low-voltage bridge vertical timing feature; d, a relationship between the high-voltage bridge alternating current inflow conduction width and the low-voltage bridge alternating current outflow conduction width is defined as a double-bridge vertical timing feature; e, a relationship between the direct current inflow conduction width and the high-voltage bridge alternating current outflow conduction width is defined as a high-voltage bridge top horizontal timing feature; f, a relationship between the direct current inflow conduction width and the low-voltage bridge alternating current outflow conduction width is defined as a low-voltage bridge top horizontal timing feature; g, a relationship between the high-voltage bridge alternating current inflow conduction width and the direct current outflow conduction width is defined as a high-voltage bridge bottom horizontal timing feature; and h, a relationship between the low-voltage bridge alternating current inflow conduction width and the direct current outflow conduction width is defined as a low-voltage bridge bottom horizontal timing feature.

In this embodiment, the foregoing timing features at a-h are collectively referred to as the horizontal and vertical timing features, which are described by the following formulas:

$$\begin{cases} t_{DCVTF} = t_{dH} - t_{dN} \\ t_{ACVTF\_HB} = t_{Y\_top} - t_{Y\_bottom} \\ t_{ACVTF\_LB} = t_{D\_top} - t_{D\_bottom} \\ t_{ACVTF\_HLB} = t_{Y\_bottom} - t_{D\_top} \end{cases} ; \begin{cases} t_{THTF\_HB} = t_{dH} - t_{Y\_top} \\ t_{THTF\_LB} = t_{dH} - t_{D\_top} \\ t_{BHTF\_HB} = t_{dN} - t_{Y\_bottom} \\ t_{BHTF\_LB} = t_{dN} - t_{D\_bottom} \end{cases}$$

where $t_{DCVTF}$ represents the direct-current vertical timing feature, $t_{ACVTF\_HB}$ represents the high-voltage bridge vertical timing feature, $t_{ACVTF\_LB}$ represents the low-voltage bridge vertical timing feature, $t_{ACVTF\_HLB}$ represents the double-bridge vertical timing feature, $t_{THTF\_HB}$ represents the high-voltage bridge top horizontal timing feature, $t_{THTF\_LB}$ represents the low-voltage bridge top horizontal timing feature, $t_{BHTF\_HB}$ represents the high-voltage bridge bottom horizontal timing feature, and $t_{BHTF\_LB}$ represents the low-voltage bridge bottom horizontal timing feature.

At S104, the time width of each valve conduction state is compared with a time width of a normal valve conduction state, and each valve state signal is output.

(1) In normal operation, three phases and six valves of the j bridge are successively and alternately triggered to conduct at equal phase intervals of 60°. In the meantime, according to the formula of step S1023, the time width of the normal valve conduction state is obtained. The specific formula is as follows:

$$t_{HT\_normal} = \frac{T}{3}$$

where $t_{HVT\_normal}$ represents the time width of the normal valve conduction state.

(2) The time width $t_{jHVm}$ of each valve conduction state calculated in step S1023 is compared with the time width $t_{HVT\_normal}$ of the normal valve conduction state to determine whether each valve conduction state is abnormal. The specific formula is as follows:

$$\begin{cases} \left| t_{jHVm} - t_{HVT_{normal}} \right| \le \varepsilon; \text{ valve normal} \\ \left| t_{jHVm} - t_{HVT_{normal}} \right| > \varepsilon; \text{ valve abnormal} \end{cases}$$

where j=Y/D, m=1, 2, 3, 4, 5, 6, and $\varepsilon$ represents a threshold.

(3) An abnormal valve is located according to an output state via a range comparator through the foregoing time width $t_{jHVm}$ of each valve conduction state calculated in step S1023. The specific formula is as follows:

$$cs_{jHVm} = \begin{cases} 1; \, t_{jHVm} - t_{HVT\_normal} > \varepsilon \\ 0; -\varepsilon \le t_{jHVm} - t_{HVT\_normal} \le \varepsilon \\ -1; t_{jHVm} - t_{HVT\_normal} < -\varepsilon \end{cases}$$

where j=Y/D, m=1, 2, 3, 4, 5, 6, $\varepsilon$ represents a threshold, $cs_{jHVm}$ represents a valve state signal, 1 represents that the valve conduction state is overlong, 0 represents that the valve conduction state is normal, and −1 represents that the valve conduction state is shortened.

At S105, valve-level fault location for the converter is implemented according to the time width of each valve conduction state, the alternating current conduction width, the direct current conduction width, the horizontal and vertical timing features, each valve state signal, and the current data.

As shown in FIG. 2, converter faults include internal faults k1-k5, external faults k6-k8, and a line fault k9.

As shown in FIG. 4, the specific steps of step S105 in this embodiment are as follows.

At S1051, it is determined whether the direct current inflow conduction width is less than the power frequency cycle. If yes, it is determined that the fault is the line fault k9. If no, step S1052 is performed.

At S1052, it is determined whether the direct-current vertical timing feature satisfies $t_{dH}-t_{dN}>\Delta$, where $\Delta$ is a value greater than 0. If yes, step S1053 is performed. If no, step S1054 is performed.

At S1053, it is determined whether the high-voltage bridge vertical timing feature satisfies $t_{Y\_top} \ne t_{Y\_bottom}$ or whether the low-voltage bridge vertical timing feature satisfies $t_{D\_top} \ne t_{D\_bottom}$. If yes, it is determined that the fault is the external fault k7. If no, it is determined that the faults are the external faults k4 and k5.

At S1054, it is determined whether there is an abnormal valve state signal in twelve converter valves. If yes, step S1055 is performed. If no, step S101 is performed again.

At S1055, it is determined whether three conditions are simultaneously satisfied: (1) a maximum value of the direct-current high-voltage current and the direct-current neutral current is greater than a maximum value of the three-phase alternating currents of the j bridge, (2) commutation fails, and (3) there is no difference in high-voltage bridge or low-voltage bridge top horizontal timing features, if yes, determining that the faults are external faults k6 and k8, and if no, determining that the faults are internal faults k1, k2, and k3.

The specific implementation of the foregoing three conditions in this embodiment is as follows.

A. A magnitude relationship of an alternating current and a direct current (current data) is constructed based on the following formula:

$$\begin{cases} i_{d\,max} - i_{ac} \geq 0 \\ i_{d\,max} = \max(i_{dH}, i_{dN}) \\ i_{ac} = \max(i_{acY}, i_{acD}) \\ i_{acY} = \max(i_{Ya}, i_{Yb}, i_{Yc}) \\ i_{acD} = \max(i_{Da}, i_{Db}, i_{Dc}) \end{cases}$$

where $i_{dmax}$ is the maximum value of the direct-current high-voltage current $i_{dH}$ and the direct-current neutral current $i_{dN}$, $i_{acY}$ is the maximum value of the three-phase alternating currents $i_{Ya}$, $i_{Yb}$, and $i_{Yc}$ of the high-voltage bridge, $i_{acD}$ is the maximum value of the three-phase alternating currents $i_{Da}$, $i_{Db}$, and $i_{Dc}$ of the alternating side of the low-voltage bridge, and $i_{ac}$ is the maximum value of $i_{acY}$ and $i_{acD}$.

B. When the commutation fails, two valves being commutated must have an interlocking relationship of an overlong valve conduction state and a shortened valve conduction state, and a commutation failure criterion is constructed based on the following formula:

$$\begin{cases} cs_{jHm} = 1 \\ cs_{jHm+2} = -1 \end{cases}$$

where j=Y/D, and m=1, 2, 3, 4, 5, 6.

C. It is determined whether the high-voltage bridge top horizontal timing feature satisfies $t_{dH}=t_{Y\_top}$ or whether the low-voltage bridge bottom horizontal timing feature satisfies $t_{dH}=t_{D\_top}$.

As shown in FIG. 5, fault determination is performed using a time window width in this embodiment.

Figure 6:
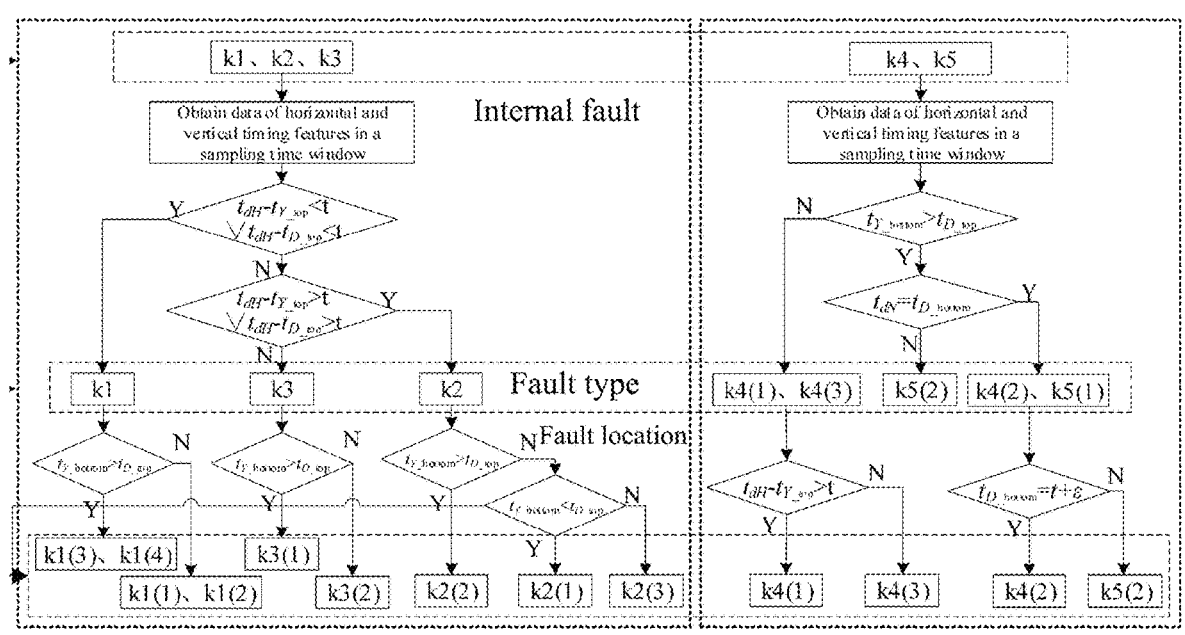
FIG. 6 is a flowchart of location of each internal fault type of a converter according to embodiment 1 of the present disclosure.

Further, as shown in FIG. 6, according to the internal faults k1-k5 located in steps S1051-S1055, in combination with step S103, data of the horizontal and vertical timing features in the time window width is obtained to determine each internal fault type. The specific steps are as follows.

At S11, horizontal and vertical timing feature data in the time window width $$t \in \left[\frac{T}{3}, \frac{T}{2}\right]$$

is obtained.

At S12, if it is detected that the difference between the high-voltage bridge or low-voltage bridge top horizontal timing features is less than the time window width t, $t_{dH}-t_{Y\_top}<t$ or $t_{dH}-t_{D\_top}<t$, it is determined the fault is k1. Otherwise, if it is detected that the difference between the high-voltage bridge or low-voltage bridge top horizontal timing features is greater than the time window width, $t_{dH}-t_{Y\_top}>t$ or $t_{dH}-t_{D\_top}>t$, it is determined the fault is k2. If not satisfied, it is determined the fault is k3.

At S13, if it is detected that the double-bridge vertical timing feature does not satisfy $t_{Y\_bottom}>t_{D\_top}$, it is determined that the faults are k4(1) and k4(3). Otherwise, it is determined whether the low-voltage bridge bottom horizontal timing feature satisfies $t_{dN}=t_{D\_bottom}$. If yes, it is determined that the faults are k4(2) and k5(1). Otherwise, it is determined that the fault is k5(2).

When the fault is k1, it is determined whether the double-bridge vertical timing feature satisfies $t_{Y\_bottom}>t_{D\_top}$. If no, it is determined that the faults are k1(1) and k1(2). If yes, it is determined that the faults are k1(3) and k1(4).

When the fault is k2, it is determined whether the double-bridge vertical timing feature satisfies $t_{Y\_bottom}>t_{D\_top}$. If yes, it is determined that the fault is k2(2). Otherwise, it is determined whether the double-bridge vertical timing feature satisfies $t_{Y\_bottom}<t_{D\_top}$. If yes, it is determined that the fault is k2(1). Otherwise, it is determined that the fault is k2(3).

When the fault is k3, it is determined whether the double-bridge vertical timing feature satisfies $t_{Y\_bottom}>t_{D\_top}$. If yes, it is determined that the fault is k3(1). Otherwise, it is determined that the fault is k3(2).

When the faults are k4(1) and k4(3), it is determined whether the difference between the high-voltage bridge and low-voltage bridge top horizontal timing features is greater than the time window width $t_{dH}-t_{Y\_top}>t$. If yes, it is determined that the fault is k4(1). Otherwise, it is determined that the fault is k4(3).

When the faults are k4(2) and k5(1), it is determined whether the low-voltage bridge alternating current conduction width satisfies $t_{D\_bottom}=t+\varepsilon$, $\varepsilon$ is a valve-abnormal threshold. If no, it is determined that the fault is k5(1). If yes, it is determined that the fault is k4(2).

Furthermore, according to internal fault types (valve-level faults at different fault locations) k1, k3, and k5, which are successfully located, in combination with step S1023, data of the time widths of six valve conduction states in a converter bridge where the internal fault types k1, k3, and k5 are located in the time window width is obtained to implement fault valve and fault phase location. The specific steps are as follows.

At S21, time width data of six valve conduction states in the time window width $$t \in \left[\frac{T}{3}, \frac{T}{2}\right]$$

is obtained.

At S22, a fault phase and a fault valve are located, specifically as follows.

Figure 7:
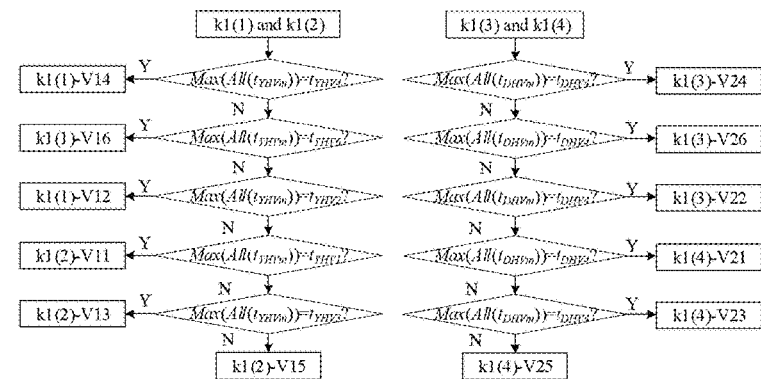
FIG. 7 is a flowchart of location of a fault valve in a fault type k1 according to Embodiment 1 of the present disclosure.

As shown in FIG. 7, when faults k1(1) and k1(2) are located, the fault valve is located according to a valve having the longest time width of the valve conduction state in six valves of a high-voltage bridge. If valve m is equal to 4, it is determined that the fault is k1(1)-V14 short circuit. The location of other different fault valves in the fault type k1 is shown in detail in FIG. 7.

Figure 8:
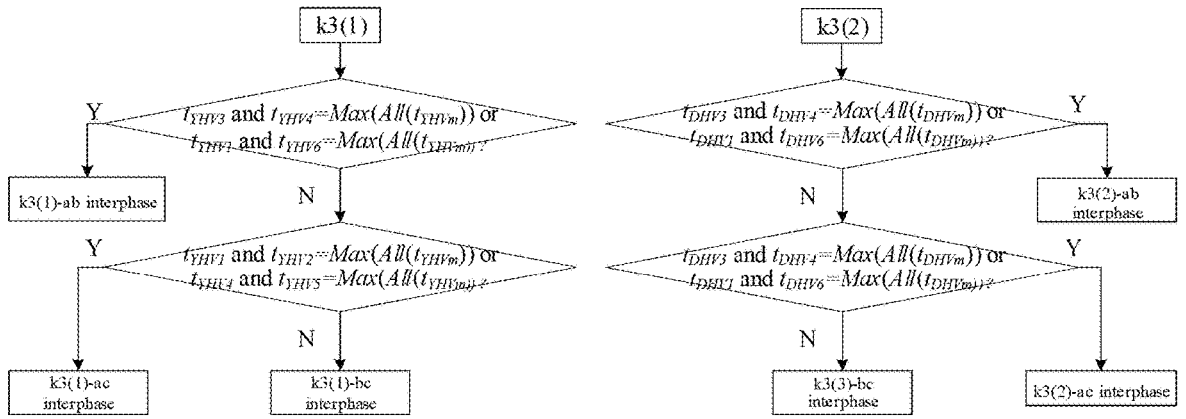
FIG. 8 is a flowchart of location of a fault phase in a fault type k3 according to Embodiment 1 of the present disclosure.

As shown in FIG. 8, when fault k3(1) is located, the fault phase is located according to two valves having the longest conduction width in the six valves of the high-voltage bridge. The location of the fault phase in the fault type k3 is shown in detail in FIG. 8.

Figure 9:
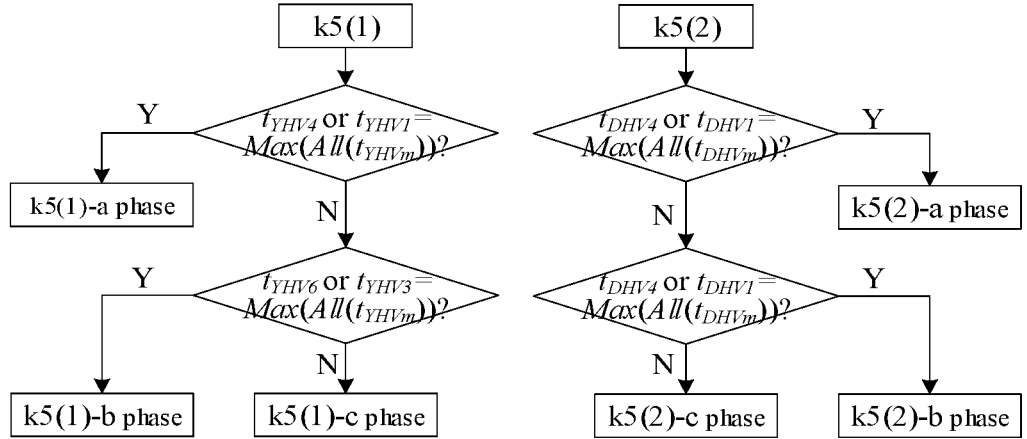
FIG. 9 is a flowchart of location of a fault phase in a fault type k5 according to Embodiment 1 of the present disclosure.

As shown in FIG. 9, when fault k5(1) is located, the fault phase is located according to a phase where the valve having the longest conduction width in the six valves of the high-voltage bridge is located. If the valve having the longest conduction width is on V1 or V4, it is determined that phase a of k5(1) is grounded. The location of other different fault phases in the fault type k5 is shown in detail in FIG. 9.

As shown in Table 1, this embodiment describes an example where an inverter-side high-voltage bridge valve V12 short-circuit fault is set at 3.101 s. According to the longest conduction width of V12 in 12 valve conduction widths, it is determined that the fault is k1(1)-V12, where the simulation results are consistent with the fault setting, which verifies the effectiveness of the method of this embodiment.

The fault location unit 1005 is configured to implement valve-level fault location for the converter according to the time width of each valve conduction state, the alternating current conduction width, the direct current conduction

TABLE 1

| | | | | | | | | | | | |
|---|---|---|---|---|---|---|---|---|---|---|---|
| | | | | | Simulation Data | | | | | | |
| | | | | | Feature quantity | | | | | | |
| | | | | | | Area 2 | | | | | |
| | Area 1 | | | | | | | | | max(All | |
| fault type | $cs_{Hn} \neq 0$ | CF | $i_{dmax} \geq i_{ac}$ | $t_{dH}/$ ms | $t_{dN}/$ ms | $t_{Y\_top}/$ ms | $t_{Y\_bottom}/$ ms | $t_{D\_top}/$ ms | $t_{D\_bottom}/$ ms | $(t_{jHVm}))/$ ms | Determination result |
| k1(1) V12 | ✓ | x | x | 20 | 20 | 19.35-14.05 | 19.35-14.05 | 20 | 20 | 11.05 | k1(1) – V12 |
| | Internal fault | | | $t_{dH} = t_{dN}$ | | $\max(t_{dH} - t_{Y\_top}) = 5.95 < 10,\ t_{Y\_top} < t_{D\_bottom},\ j = Y,\ m = 2$ | | | | | |

The simulation data of the fault location in Table 1 is divided into area 1, area 2, and determination results. In the table header: area 1 represents a criterion feature for fault area determination, where "√" indicates that the criterion is satisfied, and "x" indicates that the criterion is not satisfied; area 2 represents the range of the alternating and direct current conduction widths of fault electrical information in the time window width.

It should be noted that although the method operations of the foregoing embodiment are depicted in the drawings in a particular order, this does not require or imply that the operations must be performed in the particular order, or that all of the illustrated operations must be performed to achieve the desired results. Rather, the depicted steps may change the order of execution. Additionally or alternatively, certain steps may be omitted, multiple steps may be combined into one step for execution, and/or one step may be decomposed into multiple steps for execution.

Embodiment 2

Figure 10:
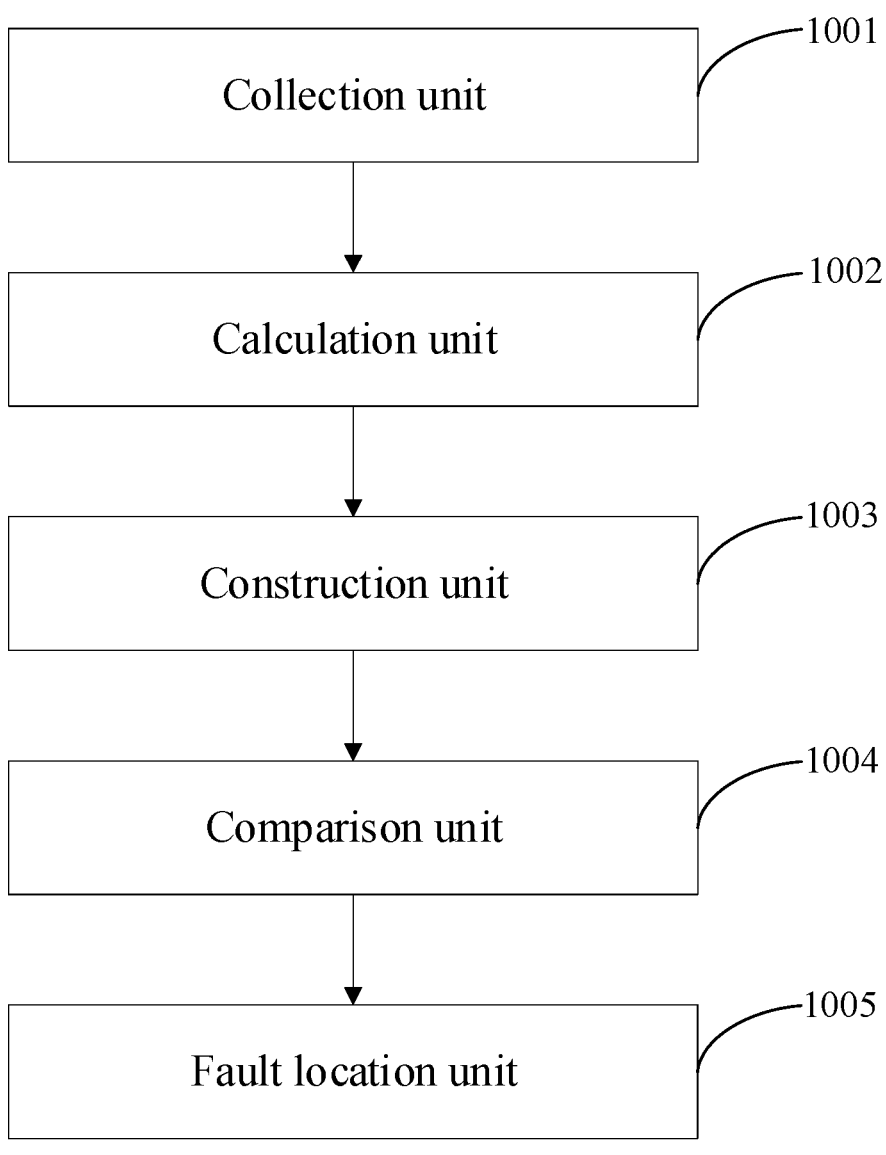
FIG. 10 is a flowchart of a valve-level fault location system for converters according to Embodiment 2 of the present disclosure.

As shown in FIG. 10, this embodiment provides a valve-level fault location system for converters based on horizontal and vertical state differences of valves. The system includes a collection unit 1001, a calculation unit 1002, a construction unit 1003, a comparison unit 1004, and a fault location unit 1005. The specific functions of each unit are as follows.

The collection unit 1001 is configured to collect current data of a converter. The current data includes three-phase alternating currents of a j bridge, a direct-current high-voltage current, and a direct-current neutral current, where j=Y/D, Y represents a high voltage, and D represents a low voltage.

The calculation unit 1002 is configured to calculate a time width of each valve conduction state, an alternating current conduction width, and a direct current conduction width based on the current data.

The construction unit 1003 is configured to construct horizontal and vertical timing features on a circuit structure of the converter according to the alternating current conduction width and the direct current conduction width.

The comparison unit 1004 is configured to compare the time width of each valve conduction state with a time width of a normal valve conduction state, and output each valve state signal.

width, the horizontal and vertical timing features, each valve state signal, and the current data.

The valve-level fault location system for converters in this embodiment further includes a further fault location unit. The further fault location unit is configured to further locate internal faults, thereby implementing fault valve and fault phase location.

It should be noted that the apparatus provided in this embodiment is merely exemplified by the division of the foregoing functional modules. In practical applications, the foregoing functional allocation may be performed by different functional modules according to needs, namely, the internal structure is divided into different functional modules so as to perform all or part of the functions described above.

Embodiment 3

Figure 11:
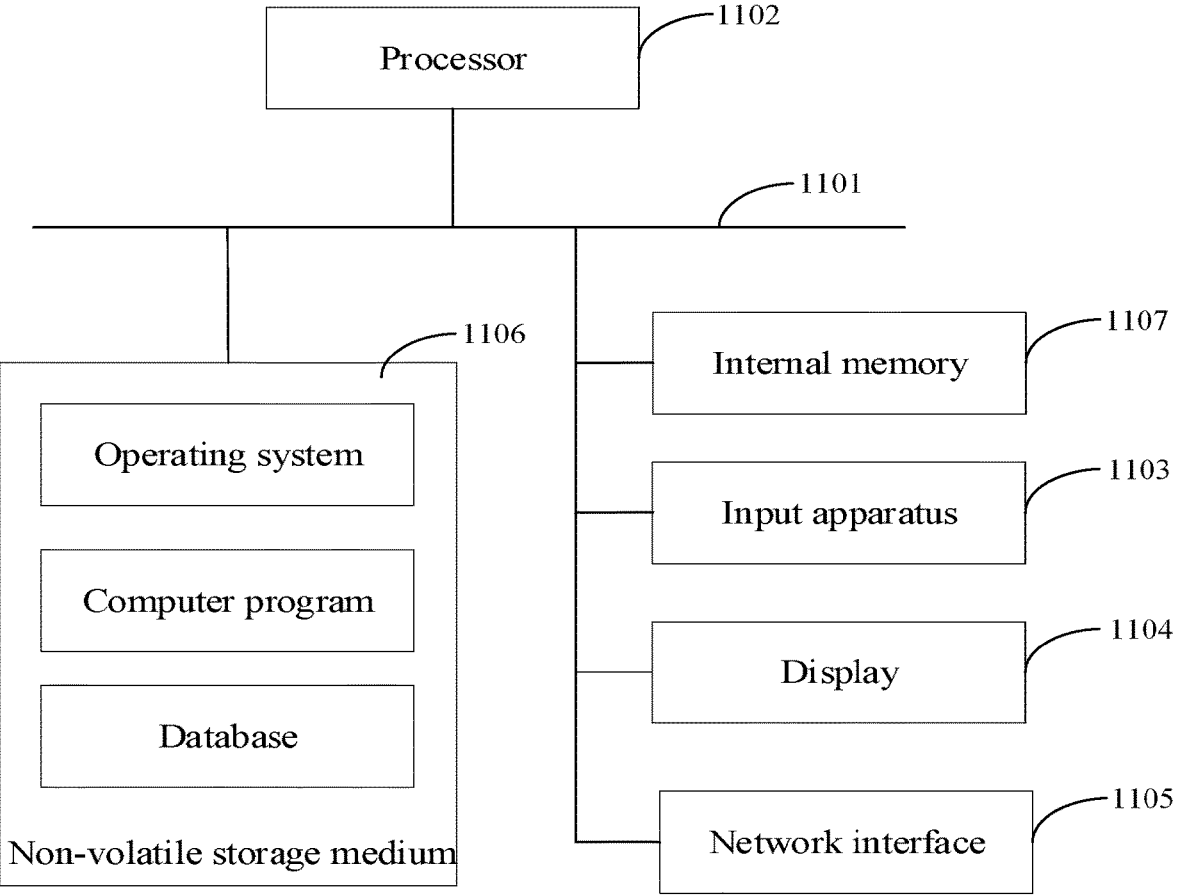
FIG. 11 is a structural block diagram of a computer device according to Embodiment 3 of the present disclosure.

As shown in FIG. 11, this embodiment provides a computer device. The computer device includes a processor 1102, a memory, an input apparatus 1103, a display apparatus 1104, and a network interface 1105 connected via a system bus 1101. The processor is configured to provide computing and control capabilities. The memory includes a non-volatile storage medium 1006 and an internal memory 1107. The non-volatile storage medium 1106 stores an operating system, a computer program, and a database. The internal memory 1107 provides an environment for the operation of the operating system and the computer program in the non-volatile storage medium. When the processor 1102 executes the computer program stored in the memory, the valve-level fault location method for converters in Embodiment 1 is implemented. The method specifically includes:

collecting current data of a converter, the current data including three-phase alternating currents of a j bridge, a direct-current high-voltage current, and a direct-current neutral current, where j=Y/D, Y representing a high voltage, and D representing a low voltage;

calculating a time width of each valve conduction state, an alternating current conduction width, and a direct current conduction width based on the current data;

constructing horizontal and vertical timing features on a circuit structure of the converter according to the alternating current conduction width and the direct current conduction width;

comparing the time width of each valve conduction state with a time width of a normal valve conduction state, and outputting each valve state signal; and implementing valve-level fault location for the converter according to the time width of each valve conduction state, the alternating current conduction width, the direct current conduction width, the horizontal and vertical timing features, each valve state signal, and the current data.

Embodiment 4

This embodiment provides a storage medium. The storage medium is a computer-readable storage medium, which stores a computer program. The computer program, when executed by a processor, implements the valve-level fault location method for converters in Embodiment 1, which specifically includes:

collecting current data of a converter, the current data including three-phase alternating currents of a j bridge, a direct-current high-voltage current, and a direct-current neutral current, where j=Y/D, Y representing a high voltage, and D representing a low voltage;

calculating a time width of each valve conduction state, an alternating current conduction width, and a direct current conduction width based on the current data;

constructing horizontal and vertical timing features on a circuit structure of the converter according to the alternating current conduction width and the direct current conduction width;

comparing the time width of each valve conduction state with a time width of a normal valve conduction state, and outputting each valve state signal; and implementing valve-level fault location for the converter according to the time width of each valve conduction state, the alternating current conduction width, the direct current conduction width, the horizontal and vertical timing features, each valve state signal, and the current data.

It should be noted that the computer-readable storage medium in this embodiment may be either a computer-readable signal medium or a computer-readable storage medium or any combination thereof. The computer-readable storage medium may be, for example but not limited to, an electronic, magnetic, optical, electromagnetic, infrared, or semiconductor system, apparatus, or device, or a combination of any of the above. More specific examples of the computer-readable storage medium may include, but are not limited to, an electrical connector having one or more wires, a portable computer disk, a hard disk, a random access memory (RAM), a read-only memory (ROM), an erasable programmable read-only memory (EPROM) or a flash memory, an optical fiber, a portable compact disc read-only memory (CD-ROM), an optical storage device, a magnetic storage device, or any suitable combination of the above.

In this embodiment, the computer-readable storage medium may be any tangible medium that contains or stores a program. The program may be used by or in connection with an instruction execution system, apparatus, or device. But in this embodiment, the computer-readable signal medium may include a data signal embodied in a baseband or propagated as part of a carrier wave carrying a computer-readable program. Such propagated data signals may take many forms, including but not limited to, electromagnetic signals, optical signals, or any suitable combination of the above. The computer-readable signal medium may also be any computer-readable storage medium other than the computer-readable storage medium. The computer-readable storage medium may send, propagate, or transport the program for use by or in connection with the instruction execution system, apparatus, or device. The computer program contained on the computer-readable storage medium may be transmitted over any suitable medium including, but not limited to, a wire, an optical cable, radio frequency (RF), and the like, or any suitable combination of the above.

The computer-readable storage medium may write the computer program for performing this embodiment in one or more programming languages, including object-oriented programming languages such as Java, python and C++, and conventional procedural programming languages, such as C or language, or a combination thereof. The program may be executed entirely on a user computer, partly on the user computer, as a stand-alone software package, partly on the user computer, partly on a remote computer, or entirely on a remote computer or server. In the case of the remote computer, the remote computer may be connected to the user computer through any kind of network, including a local area network (LAN) or a wide area network (WAN), or may be connected to an external computer (e.g. through the Internet using an Internet service provider).

In summary, according to the present disclosure, by constructing a difference between horizontal and vertical conduction widths of an alternating current and a direct current based on current timing features, valve-level faults of converters can be accurately located. In the meantime, according to the present disclosure, fault valves and fault phases of internal faults as well as external faults and line faults can be located without loss of generality. In addition, the method of the present disclosure can monitor the converter without using additional current measuring point equipment, thereby not only saving equipment cost but also having small limitations in engineering application.

The above descriptions are only preferred embodiments of the present disclosure, but the scope of protection of the present disclosure is not limited thereto. Any person skilled in the art should make equivalent replacements or modifications within the scope of the present disclosure according to the technical solutions of the present disclosure and the concept thereof. The equivalent replacements or modifications should fall within the scope of protection of the present disclosure.

The invention claimed is:

1. A valve-level fault location method for a converter based on horizontal and vertical state differences of valves, performed by a fault location system, the method being used for monitoring the converter of a high-voltage direct current transmission system, the method comprising:

measuring three-phase alternating currents of a high-voltage bridge of the converter via a high-voltage bridge alternating-current three-phase current transformer, and measuring three-phase alternating currents of a low-voltage bridge of the converter via a low-voltage bridge alternating-current three-phase current transformer; the high-voltage bridge and the low-voltage bridge each comprising a plurality of valves;

measuring a direct-current high-voltage current and a direct-current neutral current of the converter via a direct-current high-voltage direct current transformer and a direct-current neutral direct current transformer respectively;

executing the following steps by a processor:

collecting current data of the converter, the current data comprising three-phase alternating currents of a j bridge, the direct-current high-voltage current, and the direct-current neutral current, wherein the j bridge is the high-voltage bridge or the low-voltage bridge and j=Y/D, Y representing a high voltage, and D representing a low voltage;

calculating a time width of each valve conduction state based on the current data;

constructing an alternating current conduction width according to the time width of each valve conduction state, the alternating current conduction width comprising an alternating current outflow conduction width and an alternating current inflow conduction width;

constructing a direct current conduction width according to a direct-current high-voltage current amplitude and a direct-current neutral current amplitude, the direct current conduction width comprising a direct current inflow conduction width and a direct current outflow conduction width;

constructing horizontal and vertical timing features on a circuit structure of the converter according to the alternating current conduction width and the direct current conduction width;

comparing the time width of each valve conduction state with a time width of a normal valve conduction state, and outputting each valve state signal; and locating at least one of a faulty valve, a faulty phase, an external fault, or a line fault for the converter according to the time width of each valve conduction state, the alternating current conduction width, the direct current conduction width, the horizontal and vertical timing features, each valve state signal, and the current data;

the alternating current conduction width being constructed according to the time width of each valve conduction state based on the following formulas:

$$\begin{cases} t_{Y\_bottom} = Y_{YHV1} + Y_{YHV3} + Y_{YHV5} \\ t_{Y\_top} = Y_{YHV2} + Y_{YHV4} + Y_{YHV6} \end{cases}; \begin{cases} t_{D\_bottom} = Y_{DHV1} + Y_{DHV3} + Y_{DHV5} \\ t_{D\_top} = Y_{YHV2} + Y_{YHV4} + Y_{YHV6} \end{cases}$$

wherein $t_{Y\_bottom}$ represents a high-voltage bridge alternating current inflow conduction width, $t_{Y\_top}$ represents a high-voltage bridge alternating current outflow conduction width, $t_{D\_bottom}$ represents a low-voltage bridge alternating current inflow conduction width, $t_{D\_top}$ represents a low-voltage bridge alternating current outflow conduction width, $t_{YHV1}$, $t_{YHV3}$, and $t_{YHV5}$ represent time widths of a high-voltage bridge common anode valve conduction state, $t_{YHV2}$, $t_{YHV4}$, and $t_{YHV6}$ represent time widths of a high-voltage bridge common cathode valve conduction state, $t_{DHV1}$, $t_{DHV3}$, and $t_{DHV5}$ represent time widths of a low-voltage bridge common anode valve conduction state, and $t_{DHV2}$, $t_{DHV4}$, and $t_{DHV6}$ represent time widths of a low-voltage bridge common cathode valve conduction state;

the horizontal and vertical timing features being constructed on the circuit structure of the converter according to the alternating current conduction width and the direct current conduction width based on the following formulas:

$$\begin{cases} t_{DCVTF} = t_{dH} - t_{dN} \\ t_{ACVTF\_HB} = t_{Y\_top} - t_{Y\_bottom} \\ t_{ACVTF\_LB} = t_{D\_top} - t_{D\_bottom} \\ t_{ACVTF\_HLB} = t_{Y\_bottom} - t_{D\_top} \end{cases}; \begin{cases} t_{THTF\_HB} = t_{dH} - t_{Y\_top} \\ t_{THTF\_LB} = t_{dH} - t_{D\_top} \\ t_{BHTF\_HB} = t_{dN} - t_{Y\_bottom} \\ t_{BHTF\_LB} = t_{dN} - t_{D\_bottom} \end{cases}$$

wherein $t_{DCVTF}$ represents a direct-current vertical timing feature, $t_{ACVTF\_HB}$ represents a high-voltage bridge vertical timing feature, $t_{ACVTF\_LB}$ represents a low-voltage bridge vertical timing feature, $t_{ACVTF\_HLB}$ represents a double-bridge vertical timing feature, $t_{THTF\_HB}$ represents a high-voltage bridge top horizontal timing feature, $t_{THTF\_LB}$ represents a low-voltage bridge top horizontal timing feature, $t_{BHTF\_HB}$ represents a high-voltage bridge bottom horizontal timing feature, $t_{BHTF\_LB}$ represents a low-voltage bridge bottom horizontal timing feature, $t_{dH}$ represents a direct current inflow conduction width, $t_{dN}$ represents a direct current outflow conduction width, $t_{Y\_top}$ represents a high-voltage bridge alternating current outflow conduction width, $t_{Y\_bottom}$ represents a high-voltage bridge alternating current inflow conduction width, $t_{D\_top}$ represents a low-voltage bridge alternating current outflow conduction width, and $t_{D\_bottom}$ represents a low-voltage bridge alternating current inflow conduction width; and adjusting the high-voltage direct current transmission system based on fault location to ensure power transmission of the high-voltage direct current transmission system.

2. The valve-level fault location method for the converter according to claim 1, wherein the calculating a time width of each valve conduction state, an alternating current conduction width, and a direct current conduction width based on the current data specifically comprises:

calculating a plurality of valve currents of the j bridge and a valve current base value of the j bridge according to absolute values of the three-phase alternating currents of the j bridge;

selecting a ratio of one of the valve currents to the valve current base value as a valve current relative relationship, so as to obtain a plurality of valve current relative relationships; and obtaining a plurality of valve conduction states according to each valve current relative relationship, and integrating each valve conduction state to obtain a time width of each valve conduction state.

3. The valve-level fault location method for the converter according to claim 2, wherein the plurality of valve currents of the j bridge are calculated according to the absolute values of the three-phase alternating currents of the j bridge based on the following formulas:

$$i_{jV4} = \begin{cases} i_{ja}; i_{ja} > 0 \\ 0; i_{ja} \le 0 \end{cases} \quad i_{jV6} = \begin{cases} i_{jb}; i_{jb} > 0 \\ 0; i_{jb} \le 0 \end{cases} \quad i_{jV2} = \begin{cases} i_{jc}; i_{jc} > 0 \\ 0; i_{jc} \le 0 \end{cases}$$

$$i_{jV1} = \begin{cases} -i_{ja}; i_{ja} < 0 \\ 0; i_{ja} \ge 0 \end{cases} \quad i_{jV3} = \begin{cases} -i_{jb}; i_{jb} < 0 \\ 0; i_{jb} \ge 0 \end{cases} \quad i_{jV5} = \begin{cases} -i_{jc}; i_{jc} < 0 \\ 0; i_{jc} \ge 0 \end{cases}$$

wherein j=Y/D, $i_{jV1}$ represents a j-bridge V1 valve current, $i_{jV2}$ represents a j-bridge V2 valve current, $i_{jV3}$ represents a j-bridge V3 valve current, $i_{jV4}$ represents a j-bridge V4 valve current, $i_{jV5}$ represents a j-bridge V5 valve current, and $i_{jV6}$ represents a j-bridge V6 valve current, wherein $i_{ja}$, $i_{jb}$, and $i_{jc}$, ijb, ijc represent the three-phase alternating current of the j bridge; and the calculating a valve current base value of the j bridge according to absolute values of the three-phase alternating currents of the j bridge specifically comprises: selecting half of a maximum value in the absolute values of the three-phase alternating currents of the j bridge as a valve current base value $i_{jbase}$ of the j bridge.

4. The valve-level fault location method for the converters according to claim 2, wherein the obtaining a plurality of valve conduction states according to each valve current relative relationship and integrating each valve conduction state to obtain a time width of each valve conduction state specifically comprises:

inputting each valve current relative relationship into a single-phase comparator, and obtaining a duty ratio of each valve current;

selecting a state in which the duty ratio of the valve current is greater than 1 as a valve conduction state, so as to obtain a plurality of valve conduction states; and integrating each valve conduction state to obtain the time width of each valve conduction state based on the following formula:

$$t_{jHVm} = \int_{-T}^{0} S_{jHVm} dt$$

wherein j=Y/D, m=1, 2, 3, 4, 5, 6, $S_{jHVm}$ represents a j-bridge Vm valve conduction state, $t_{jHVm}$ represents a time width of the j-bridge Vm valve conduction state, and T represents a time width of a power frequency cycle.

5. The valve-level fault location method for the converter according to claim 2, wherein—the constructing a direct current conduction width according to a direct-current high-voltage current amplitude and a direct-current neutral current amplitude specifically comprises:

defining a flow state of a direct-current high-voltage current and a flow state of a direct-current neutral current according to the direct-current high-voltage current amplitude and the direct-current neutral current amplitude based on the following formulas:

$$S_{dH} = \begin{cases} 1; i_{dH} \geq i_{set} \\ 0; i_{dH} < i_{set} \end{cases}; \quad S_{dN} = \begin{cases} 1; i_{dN} \geq i_{set} \\ 0; i_{dN} < i_{set} \end{cases}$$

wherein $i_{dH}$ represents the direct-current high-voltage current, id represents the direct-current neutral current, $S_{dH}$ represents the flow state of the direct-current high-voltage current, $S_{dN}$ represents the flow state of the direct-current neutral current, and $i_{set}$ represents a threshold of a direct current flow state; and integrating the flow state of the direct-current high-voltage current and the flow state of the direct-current neutral current in each power frequency cycle to obtain a direct current conduction width based on the following formulas:

$$t_{dH} = \int_{t-T}^{t} S_{dH} dt; \quad t_{dN} = \int_{t-T}^{t} S_{dN} dt$$

wherein $t_{dH}$ represents a direct current inflow conduction width, $t_{dN}$ represents a direct current outflow conduction width, and T represents a time width of a power frequency cycle.

6. The valve-level fault location method for the converter according to claim 1, wherein the implementing valve-level fault location for the converter according to the time width of each valve conduction state, the alternating current conduction width, the direct current conduction width, the horizontal and vertical timing features, each valve state signal, and the current data specifically comprises:

determining whether the direct current inflow conduction width is less than the power frequency cycle;

determining that a fault is a line fault k9 if the direct current inflow conduction width is less than the power frequency cycle;

determining whether the direct-current vertical timing feature satisfies $t_{dH}-t_{dN}>\Delta$ if the direct current inflow conduction width is greater than or equal to the power frequency cycle, wherein $\Delta$ represents a value greater than 0;

determining whether the high-voltage bridge vertical timing feature satisfies $t_{Y\_top} \neq t_{Y\_bottom}$ or whether the low-voltage bridge vertical timing feature satisfies $t_{D\_top} \neq t_{D\_bottom}$ if the direct-current vertical timing feature satisfies $t_{dH}-t_{dN}>\Delta$;

determining that the fault is an external fault k7 if the high-voltage bridge vertical timing feature satisfies $t_{Y\_top} \neq t_{Y\_bottom}$ or the low-voltage bridge vertical timing feature satisfies $t_{D\_top} \neq t_{D\_bottom}$;

determining that the faults are internal fault k4 and k5 if the high-voltage bridge vertical timing feature does not satisfy $t_{Y\_top} \neq t_{Y\_bottom}$ or the low-voltage bridge vertical timing feature does not satisfy $t_{D\_top} \neq t_{D\_bottom}$;

determining whether the valve state signal is abnormal according to each valve state signal if the direct-current vertical timing feature does not satisfy $t_{dH}-t_{dN}>\Delta$;

determining, if the valve state signal is abnormal, whether three conditions are simultaneously satisfied: a maximum value of the direct-current high-voltage current and the direct-current neutral current is greater than a maximum value of the three-phase alternating currents of the j bridge, commutation fails, and there is no difference in high-voltage bridge or low-voltage bridge top horizontal timing features, if yes, determining that the faults are external faults k6 and k8, and if no, determining that the faults are internal faults k1, k2, and k3; and returning to collecting current data of a converter if the valve state signal is not abnormal.

7. The valve-level fault location method for the converter according to claim 6, further comprising:

further locating the internal faults to implement fault valve and fault phase location, specifically:

determining each internal fault type using data of the horizontal and vertical timing features in a time window width according to internal faults k1-k5, and obtaining internal fault types of k1, k3, and k5 which are successfully determined; and implementing fault valve and fault phase location using data of the time width of each valve conduction state in a converter bridge where the internal fault types of k1, k3, and k5 are located in the time window width.

8. A valve-level fault location system for a converter based on horizontal and vertical state differences of valves, the fault location system being used for monitoring the converter of a high-voltage direct current transmission system, the fault location system comprising: . . .

a collection unit, configured to collect current data of the converter, the current data . . .

and $t_{D\_bottom}$ represent a low-voltage bridge alternating current inflow conduction width; and adjusting the high-voltage direct current transmission system based on fault location to ensure power transmission of the high-voltage direct current transmission system.

* * * * *